United States Patent [19]

Chester

[11] Patent Number: 5,515,402
[45] Date of Patent: May 7, 1996

[54] QUADRATURE FILTER WITH REAL CONVERSION

[75] Inventor: David B. Chester, Palm Bay, Fla.

[73] Assignee: Harris Corporation, Melbourne, Fla.

[21] Appl. No.: 930,072

[22] Filed: Aug. 14, 1992

[51] Int. Cl.⁶ .................................................. H04B 1/10
[52] U.S. Cl. .................... 375/350; 375/229; 364/724.19; 364/724.1
[58] Field of Search .................... 375/103, 11, 12, 375/13, 14; 364/724.01, 724.03, 724.1, 724.17, 724.16, 724.19, 724.2

[56] References Cited

U.S. PATENT DOCUMENTS

| | | | |
|---|---|---|---|
| 4,344,149 | 8/1982 | Van de Meeberg | 364/724.1 |
| 4,757,516 | 7/1988 | Yoshimoto et al. | 375/15 |
| 4,843,581 | 6/1989 | Cupo et al. | 364/724.1 |
| 4,893,265 | 1/1990 | Hirosaki | 364/724.1 |
| 5,051,981 | 9/1991 | Kline | 364/724.1 |
| 5,067,141 | 11/1991 | Chitchlow et al. | 364/724.1 |

*Primary Examiner*—Stephen Chin
*Assistant Examiner*—Bryan Webster
*Attorney, Agent, or Firm*—Rogers & Killeen

[57] ABSTRACT

A quadrature decimation filter with real output formed from a mixture of both in-phase and quadrature signals by upconversion and alternating stream combination. The in-phase and quadrature branch computations run simultaneously with a delay of the in-phase data stream relative to the quadrature data stream so that a common filter coefficient may be used simultaneously in nonzero branch computations.

20 Claims, 5 Drawing Sheets

QUADRATURE FILTER WITH REAL CONVERSION

BACKGROUND AND SUMMARY OF THE INVENTIONS

The present invention relates to electronic devices, and, more particularly, to digital filters.

Digital Filters

Digital filter technology has come into widespread use in recent years, due to the dramatic reduction in cost of large-scale integrated circuits and the concommitant surge in digital signal processing. While analog filter technology acts on analog signals directly, digital filters work on discrete time samples. Thus, in order for a digital filter to process an analog input signal, the input signal must first be converted to a series of discrete time samples. Analog-to-digital (A/D) converters, which may employ sample-and-hold circuitry to produce a series of digital samples at discrete time intervals, have been used for this purpose.

Some applications of digital filter technology involve complex analytic signals, which are also known as quadrature signals. For example, frequency shifting signals as in digital down converters useful in communications effectively amounts to multiplication of real signals by complex exponentials. The resultant complex signals have two components, which are referred to by mathematicians as real and imaginary parts. In the field of communications, these components are referred to correspondingly as in-phase and quadrature components. In-phase and quadrature components may be filtered separately, and the results combined to produce a real filtered signal. Of course, the in-phase and quadrature components are related because they derive from the same real signal, and both must be used to produce a real filtered signal if no information is to be lost.

Once a series of discrete time samples has been produced, the series may be filtered digitally in the following manner: First, a series of coefficients are selected. The number of coefficients selected is called the order of the digital filter. The values of the coefficients determine the impulse response of the filter. For each time interval, the discrete time samples are scaled by the coefficients, and the scaled samples are added together. The sum is output as a discrete time sample. A series of these discrete time samples constitutes a filtered signal. This is an example of a finite impulse response (FIR) filter if the order is finite. In effect the filter convolves the coefficients with the discrete time samples, and this corresponds to multiplication of the Fourier transforms. See generally, Oppenheim and Schafer, Digital Signal Processing (Prentice Hall 1975) for discussion of both finite and infinite impulse response systems, and Crochiere and Rabiner, Multirate Digital Signal Processing (Prentice Hall 1983).

Digital filters are sometimes implemented using a shift register having a number of stages equal to the order of the filter. Thus, the discrete time samples may be shifted through the shift register, one shift per time interval. One of the coefficients may be assigned to each stage, so that for each time interval, the discrete time samples occupying the stages are scaled by the coefficients. Such scaling may be implemented by programming a microprocessor to perform a series of calculations for each time interval. The calculations include multiplying the coefficients by the contents of the respective stages of the shift register.

Sampling

The discrete time interval over which the discrete time samples are sampled from the input analog signal is chosen depending on the frequency bandwidth of the input signal. According to the Nyquist Sampling Theorem, the highest frequency which may be reproduced accurately from discrete time samples is that frequency whose period (the reciprocal of the frequency) is twice the sampling time interval. That is, if the sampling time interval is T, so the sampling frequency $f_s$ is 1/T, then analog signals with a spectrum bounded by $-f_s/2$ and $f_s/2$ may be accurately reproduced. Thus, systems which digitize analog signals employ sampling rates based on the desired frequency bandwidth. For instance, many digital audio systems are designed to treat the upper limit of the human audible spectrum as 20,000 Hz, and employ digital signals sampled 40,000 times per second.

Many digital filters calculate a filtered value every sampling time interval. The calculation involves scaling, i.e., multiplying each sample by the appropriate coefficient, and adding the scaled samples to produce a sum. Digital multiplication requires a fairly complex algorithm, typically involving a sequence of adds and shifts. Thus, a considerable amount of time may be required each time interval to complete the calculation. If the digital filter is implemented in a computer system, employing a microprocessor for instance, the processor may be programmed to execute other tasks as well as the digital filter calculations. Thus, repeating lengthy calculations at short time intervals may delay other tasks. If, on the other hand, a processor is solely dedicated to the digital filter, the length of time required for the calculations may place a lower limit on the time interval. This would effectively place an upper limit on the frequencies which could be sampled and reproduced consistent with the Nyquist Theorem. These limitations on the time interval and the frequency present problems which limit the applications to which digital filters can be put.

Features

The present invention provides a digital filter which reduces the number of calculations which must be performed to produce a real signal including a sequence of discrete time filtered digital samples from a complex analytic or complex signal including a sequence of discrete time real part digital samples and a sequence of discrete time imaginary part digital samples.

The invention also provides a digital filter which performs the calculations for generating a real filtered signal at a time interval that can be longer than the interval between input complex samples.

The invention provides a digital filter which upconverts a complex analytic signal which includes a sequence of in-phase samples and a sequence of quadrature samples by a predetermined upconversion frequency such that some in-phase and some quadrature samples, when upconverted, have a value 0, thereby making it possible to omit calculation of those in-phase and quadrature samples.

BRIEF DESCRIPTION OF THE DRAWINGS

The invention will be understood based on the following detailed description with reference to the drawings, which are schematic for clarity.

DESCRIPTION OF THE PREFERRED EMBODIMENTS

Overview

Figure 1:
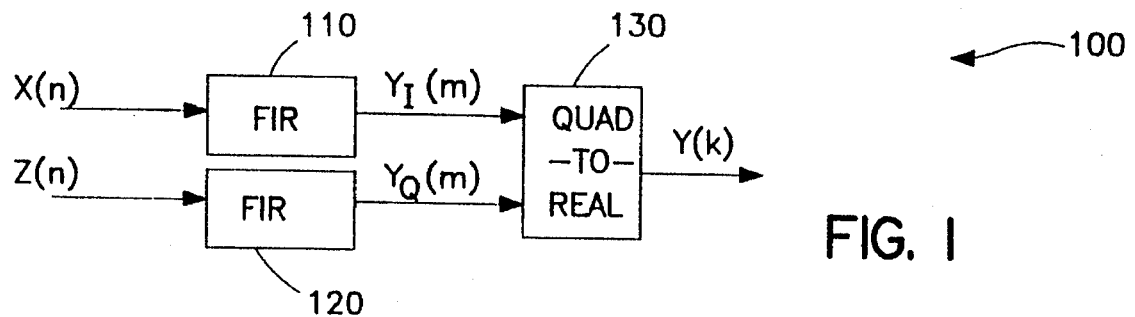
FIG. 1 illustrates preferred embodiments in block form.

FIG. 1 illustrates the overall operation of the first preferred quadrature embodiment filter and real converter, generally denoted by reference numeral 100. In particular, the first preferred embodiment includes finite impulse response (FIR) filters 110 and 120 plus a quadrature-to-real converter 130. Filters 110 and 120 have the same coefficients (same impulse response) so together filters 110 and 120 form a symmetric quadrature FIR filter. The real input sequences $x(n)$ and $z(n)$ for integer n are the in-phase and quadrature components of a complex input sequence which typically arises as samples of analog signals taken a regular time interval. For example, if $s_{analog}(t)$ is a real analog signal, let $s(n)=s_{analog}(nT)$ where T is the sampling time interval, and $x(n)+jz(n)=s(n)e^{-j2\pi fnT}$ where f is a down shift frequency. The sampling frequency, $f_s$, thus equals $1/T$. Of course, $x(n)$ and $z(n)$ will be quantized for digital signal processing. For example, $f_s$ may be on the order of 50 MHz, and $x(n)$ and $(z)$ may be quantized to 16 bits for a dynamic range of roughly 100 dB. The real output sequences from filters 110 and 120, $y_I(m)$ and $y_Q(m)$, are the in-phase and quadrature components of the complex analytic output sequence $y_I+jy_Q$. If the impulse response of filters 110 and 120 is $h(n)$, then $y_I(n)=h(n)\oplus x(n)$ and $y_Q(n)=h(n)\oplus z(n)$. Converter 130 combines $y_I(m)$ and $y_Q(m)$ to form a single real output sequence, $y(k)$, by taking the real part of a frequency shifted version of $y_I+jy_Q$.

A realization of a quadrature FIR filter typically includes in-phase and quadrature modules which respectively receive and act upon the in-phase and quadrature samples. Typically, each module has the capacity to hold and act upon one or more samples. After each sample time interval, the module receives a new sample and discards an old sample. Thus, a module may be implemented to include a shift register having a plurality of stages. The shift register receives each new sample at a first stage, shifts the samples serially through the stages, and eventually discards samples from the last stage. The number of stages is called the order of the filter.

Filtering

A digital filter typically acts upon a sequence of samples by scaling the samples according to a series of coefficients. There will be one coefficient for each of the stages. At each time interval, each sample in the shift register is scaled by multiplication with the coefficient corresponding to the stage the sample is currently in. The scaled samples may then be added to produce a sum. The module thus produces an output sequence of filtered values made up of a sequence of successive sums. A filter for filtering a complex signal may include two shift registers, one for the real samples and another for the imaginary samples.

A quadrature FIR filter is called symmetric if both the in-phase and the quadrature components are scaled according to the same sequence of symmetric coefficients. Coefficients are symmetric if they possess a symmetry about a midpoint. Coefficient symmetry will be illustrated in the example which follows.

The following equations show an example of the in-phase output sequence $y_I(n)$ and the quadrature output sequence $y_Q(n)$ for an FIR filter having order seven with $x(n)$ and $z(n)$ the in-phase and quadrature samples, respectively:

$$y_I(n)=C_0x(n+6)+C_1x(n+5)+C_2x(n+4)+C_3x(n+3)+C_4x(n+2)+C_5x(n+1)+C_6x(n) \quad (1)$$

$$y_Q(n)=C_0z(n+6)+C_1z(n+5)+C_2z(n+4)+C_3z(n+3)+C_4z(n+2)+C_5z(n+1)+C_6z(n) \quad (2)$$

The coefficients $C_0$ through $C_6$ are symmetric if $C_0=C_6$, $C_1=C_5$, and $C_2=C_4$. In this example, the midpoint is $C_3$, and the coefficients of equal value are symmetric about $C_3$. This symmetry is more specifically called even symmetry. Odd symmetry results if $C_0=-C_6$, $C_1=-C_5$, and $C_2=-C_4$.

Equations 1 and 2 define a filter with $y_I(n)$ and $y_Q(n)$ depending only on $x(n+k)$ and $z(n+k)$ with k nonnegative. More generally, $x(n-k)$ and $z(n-k)$ terms could also enter the definitions. Also there could be an infinite number of terms in an infinite impulse response (IIR) filter. For example, the ideal lowpass filter has $h(n)=\sin(2\pi nf_c/f_s)/(\pi n/f_s)$ for both positive and negative values of n and where $f_c$ is the cutoff frequency. The coefficients of the ideal lowpass filter have even symmetry about 0 because sin() is an odd function.

Since new samples $x(n)$ and $z(n)$ are taken at each time interval T, equations 1 and 2 are likewise calculated each time interval. Various algorithms have been implemented in digital hardware to perform multiplication. Often these algorithms use a sequence of adds and shifts. Thus, a considerable amount of time, or a considerable number of system clock cycles, are consumed each time these calculations are made.

Sampling and Decimation

According to the Nyquist Sampling Theorem, an analog signal having a frequency spectrum including a highest frequency may be accurately recorded by and reproduced from a sequence of discrete time samples if the sampling rate is at least twice the highest frequency. Thus, the frequency bandwidth of the real and imaginary signals $x(n)$ and $z(n)$ are given by the expression $1/T$, where T is the sampling time interval.

If input samples have already been taken at a shorter sampling interval than that required by the output real signal under the Nyquist theorem, then some of the output samples may be discarded. For example, this may arise when the output real signal is a lowpass or bandpass filtered version of the input real signal and contains only the low frequencies of the input signal. The process of discarding samples which are not needed to satisfy the Nyquist theorem is called decimating. A decimating factor of R is used to quantify the degree of decimation. For instance, if $R=3$, then every third sample is kept, and the rest are discarded. Thus, equations 1 and 2 may be modified to reflect a decimation factor of R:

$$y_I(n)=C_0x(nR+6)+C_1x(nR+5)+\ldots+C_5x(nR+1)+C_6x(nR) \quad (3)$$

$$y_Q(n)=C_0z(nR+6)+C_1z(nR+5)+\ldots+C_5z(nR+1)+C_6z(nR) \quad (4)$$

If digital filter modules employing shift registers implement equations 3 and 4, then it will be seen that the incoming in-phase and quadrature samples are shifted R number of times through the shift registers between each successive time that $y_I$ and $y_Q$ are calculated. In other words, the calculations are made once for each time interval RT. Decimation thus lengthens the time interval between calculations. Lengthening the interval is advantageous because the means for doing the calculation, such as a CPU, is less burdened with processing time and has more time to service other system tasks, if any, between calculations. Also, the length of time required for the calculations is less likely to be a limitation on the bandwidth of the filter.

Upconversion to Real

Figure 2:
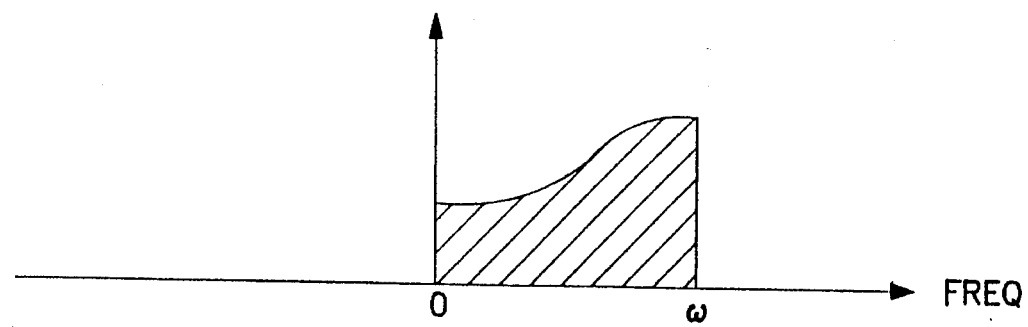
FIGS. 2–7 show various spectra of signals.
Figure 3:
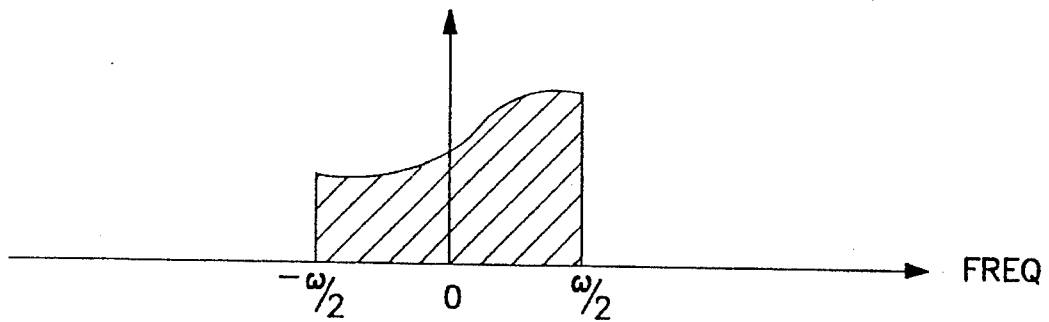

Complex analytic signals are spectrally one-sided because the quadrature component is the Hilbert transform of the in-phase component. This means that the spectrum of such a signal may be graphed as shown by the magnitude of the Fourier transform of the signal in FIG. 2. It will be seen that the bandwidth of the signal runs from 0 to $\omega$ and that there are no negative frequency components of the signal. This can be contrasted with the two-sided real form of the signal shown in FIG. 4. For example, $e^{j\omega n}$ has frequency to but the real and imaginary parts, $\cos(\omega n)$ and $\sin(\omega n)$, each has two frequencies: $-\omega$ and $\omega$. Because the complex analytic signal of FIG. 2 is spectrally one-sided, the signal may be down-shifted, i.e., shifted in frequency so that its bandwidth runs from $-\omega/2$ to $\omega/2$, as shown in FIG. 3. Because the bandwidths of the signals shown in FIGS. 2 and 3 are each $\omega$, samples may be taken at longer time intervals.

Operating on a complex analytic signal with spectrum down-shifted and centered at 0 presents the advantage that a lowpass filtering operation is equivalent to a bandpass filtering operation on a signal not centered at 0.

Figure 4:
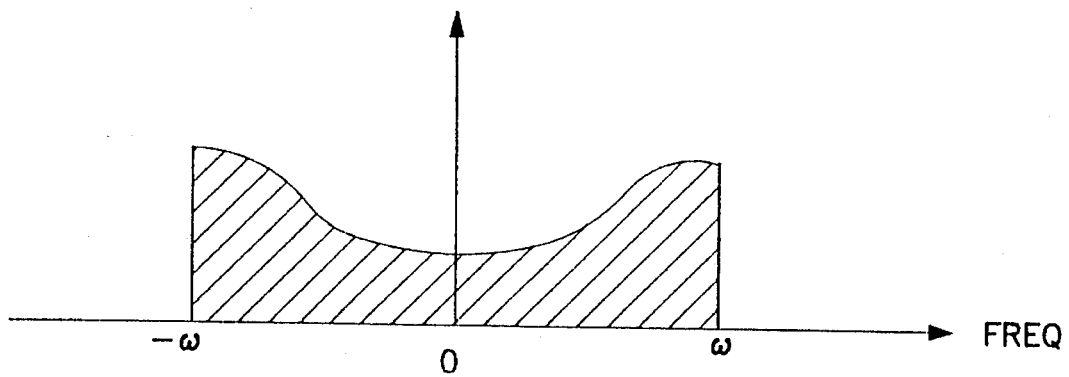

To form a real signal from a complex analytic signal with spectrum down-shifted and centered at 0 as shown in FIG. 3, the signal is upconverted to all positive frequencies which precludes aliasing, as shown in FIG. 2. If the complex analytic signal with spectrum shown in FIG. 2 is to be converted to a real signal with spectrum as shown in FIG. 4 by combining the in-phase and quadrature components of the signal, the sampling interval for the real signal must be preserved in the complex analytic signal to make this conversion possible.

Aliasing is a phenomenon in which frequencies in violation of the Nyquist theorem appear as false frequencies. For example, the analog signals $u_{analog}(t)= \cos(2\pi f_1 t)$ and $v_{analog}(t)=\cos(2\pi f_2 t)$ have the same samples $u(n)=v(n)$ when sampled at the sampling frequency $f_s$ if $f_1-f_2=f_s$. That is, if $f_1$ were just a little larger than the sampling frequency, $f_s$, the samples of $u_{analog}$ would appear to be samples of the low frequency signal $v_{analog}$ with $f_2=f_1-f_s$. Further, if a spectrally two-sided signal, i.e., a signal having both positive and negative frequencies, were decimated so that there were only enough spectral space for the positive frequencies, then negative frequencies (the left side of FIG. 4) would shift over into positive frequencies (the right side of FIG. 4). Thus, the signal would be distorted.

Shifting a complex analytic signal in frequency may be expressed mathematically in terms of multiplication by the following function:

(5) $e^{j2\pi n\phi/f_s}$ where $f_s$ is the sampling rate, i.e. the reciprocal of T, and $\phi$ is an upconvert frequency. By Euler's Equation, function 5 is equivalent to $$\cos(2\pi n\phi/f_s)+j\sin(2\pi n\phi/f_s) \quad (6)$$

The cos and sin expressions in function 6 give the in-phase and quadrature components, respectively, of the complex analytic signal upconvert function which is sampled at the same rate as the complex analytic components $y_I$ and $y_Q$.

The up conversion frequency may be selected such that, for certain values of n, the arguments of the cos or the sin expressions are, respectively, odd or even multiples of $\pi/2$. For these values of n, the in-phase or the quadrature upconversion factors have the value 0. As a consequence, upconverting the complex analytic signal by multiplying it by the upconversion factor produces a product of 0 for these values of n. For instance, if $\phi=f_s/4$, then function 5 becomes $$e^{jn\pi/2} \quad (7)$$

Function 6 then becomes $$\cos(n\pi/2)+j\sin(n\pi/2) \quad (8)$$

For odd values of n, the real part of function 8 is 0 and the imaginary part is an alternating 1 and $-1$. For even values of n, the imaginary part of function 8 is 0 and the real part is an alternating 1 and $-1$. Thus, for integral values of n, upconversion simply involves multiplying one of the parts by 0, and multiplying the other part by 1 or $-1$. Since converting the complex analytic signal to a real signal is equivalent to taking the real part of or the imaginary part of the complex product of the complex analytic output of the quadrature filters and the upconversion function, only the real arithmetic processes necessary to obtain the real part are required.

However, calculations according to equation 3 or 4 may still consume a considerable amount of time before arriving at values which will ultimately be multiplied by 0 in the upconversion. In accordance with the invention, calculations for the terms which will be multiplied by zero are omitted. Thus, the time that would have been spent calculating the zero terms is saved. Specifically, for even values of n, only the in-phase part of equation 7 is non-zero, so calculations according to equation 3 are only performed for even values of n. Similarly, for odd values of n, only the quadrature part of equation 7 is non-zero, so calculations according to equation 4 are only performed for odd values of n.

An upconversion frequency of $\phi=\omega/2=f_s/4$ is deemed to be the best mode for practicing the invention. Higher and lower upconversion factors are each deemed to be less advantageous. Lower upconversion frequencies are insufficient to prevent aliasing. As will be seen from FIGS. 2 and 3, $\phi=f_s/4$ is the upconversion factor which upconverts the spectrum of FIG. 3 to that of FIG. 2. A lower upconversion frequency would leave part of the spectrum to the left of the ordinate of the graph, and therefore would not be sufficient to preclude aliasing. For instance, if the FIG. 3 spectrum were upconverted according to $\phi=f_s/8$, the bandwidth would run from $-\omega/4$ to $3\omega/4$. Since this up converted bandwidth includes both positive and negative portions, aliasing would result.

An upconversion frequency greater than $\phi=f_s/4$ would preclude aliasing, and therefore could be practiced. However, such upconversion frequencies would be somewhat less advantageous. This is because the highest frequency would be greater than $\omega$, and a shorter sampling interval would be required to satisfy the Nyquist Theorem.

In terms of hardware implementation, the example of equation 7 presents an essential advantage in that for all values of n, either $y_I(n)$ or $y_Q(n)$ is multiplied by 0 as a consequence of upconversion. Thus, combining $y_I$ to $y_Q$ to produce y may be accomplished by simply multiplexing $y_I$ and $y_Q$, selecting whichever is non-zero for the given value of n. From equation 8, it will be seen that non-zero upconverted in-phase and quadrature samples have alternating positive and negative magnitudes. Accordingly, after $y_I$ and $y_Q$ are multiplexed, for appropriate values of n, the result is complemented.

With the above analysis of the effects of frequency upshifting according to equation 8 in mind, it will be seen that, while the total amount of calculation is reduced, for any given non-decimated time interval at least one of the parts, in-phase or quadrature, is calculated. It would be preferable to eliminate entirely the calculations during some time intervals. In accordance with the invention, calculations for certain time intervals may be eliminated entirely by synchronizing the calculation of terms which will be multiplied by 0 for upshifting. This may be done by delaying either the real or the imaginary samples by a number of time intervals equal to the decimating factor.

For instance, consider equations 3 and 4, where the decimation factor is R= 2. For n=0 through 4, equations 3 and 4 are as follows:

$$y_I(0)=C_0x(6)+C_1x(5)+\ldots+C_5x(1)+C_6x(0)$$

$$y_Q(0)=C_0z(6)+C_1z(5)+\ldots+C_5z(1)+C_6z(0)$$

$$y_I(1)=C_0x(8)+C_1x(7)+\ldots+C_5x(3)+C_6x(2)$$

$$y_Q(1)=C_0z(8)+C_1z(7)+\ldots+C_5z(3)+C_6z(2)$$

$$y_I(2)=C_0x(10)+C_1x(9)+\ldots+C_5x(5)+C_6x(4)$$

$$y_Q(2)=C_0z(10)+C_1z(9)+\ldots+C_5z(5)+C_6z(4)$$

$$y_I(3)=C_0x(12)+C_1x(11)+\ldots+C_5x(7)+C_6x(6)$$

$$y_Q(3)=C_0z(12)+C_1z(11)+\ldots+C_5z(7)+C_6z(6)$$

$$y_I(4)=C_0x(14)+C_1x(13)+\ldots+C_5x(9)+C_6x(8)$$

$$y_Q(4)=C_0z(14)+C_1z(13)+\ldots+C_5z(9)+C_6z(8)$$

In the upconversion and conversion to real processes, the product of the in-phase part of equation 7 and equation 3 is summed with the product of the quadrature part of equation 7 and equation 4. That is, take the real part for $[y_I(n)+jy_Q(n)]e^{jn\pi/2}$. Note that the sampling time interval for $y_I$ and $y_Q$ is twice as long as that of x and z due to the decimation factor R=2, and that the upconversion by $f_s/4$ is based on $f_s$ being the sampling frequency of $y_I$ and $y_Q$, not on the sampling frequency of x and z. Thus, the output real sequence y is as follows:

$$y=y_I(0), -y_Q(1), -y_I(2), y_Q(3), y_I(4), \quad (10)$$

Given the above equations, it will be seen that delaying either the real or the imaginary samples by two time intervals will synchronize the terms multiplied by 0 in upconversion. For instance, if the in-phase samples are delayed by 2T, then at time 6T, only $y_Q(0)$ will be calculated. At time 8T, $y_I(0)$ and $y_Q(1)$ will be calculated. At time 10T, $y_I(1)$ and $y_Q(2)$ will be calculated. At time 12T, $y_I(2)$ and $y_Q(3)$ will be calculated. At time 14T, $y_I(3)$ and $y_Q(4)$ will be calculated, and so on. From the equations above, it will be seen that the calculations at times 6T, 10T, 14T, etc., would produce in-phase and quadrature parts which will be multiplied by 0 in upconversion. Thus, the calculations at times 6T, 10T, 14T, etc., may be eliminated entirely. Every second calculation, i.e., calculations which would have been made at times 9T, 11T, 13T, etc., were previously eliminated due to the decimation factor of 2 in the quadrature filter. Every second remaining calculation, i.e., calculations at times 6T, 10T, 14T, etc., has now been eliminated by delaying an input stream of samples to synchronize terms upconverted by multiplying by 0. This additional elimination of calculations effectively produces an additional decimation factor of 2.

Example

An example, where the decimation factor R is 3 and the upconversion frequency is according to equation 7, will now be discussed. For n=0 through 4, equations 3 and 4 become as follows:

$$y_I(0)=C_0x(6)+C_1x(5)+\ldots+C_5x(1)+C_6x(0)$$

$$y_Q(0)=C_0z(6)+C_1z(5)+\ldots+C_5z(1)+C_6z(0)$$

$$y_I(1)=C_0x(9)+C_1x(8)+\ldots+C_5x(4)+C_6x(3)$$

$$y_Q(1)=C_0z(9)+C_1z(8)+\ldots+C_5z(4)+C_6z(3)$$

$$y_I(2)=C_0x(12)+C_1x(11)+\ldots+C_5x(7)+C_6x(6)$$

$$y_Q(2)=C_0z(12)+C_1z(11)+\ldots+C_5z(7)+C_6z(6)$$

$$y_I(3)=C_0x(15)+C_1x(14)+\ldots+C_5x(10)+C_6x(9)$$

$$y_Q(3)=C_0z(15)+C_1z(14)+\ldots+C_5z(10)+C_6z(9)$$

$$y_I(4)=C_0x(18)+C_1x(17)+\ldots+C_5x(13)+C_6x(12)$$

$$y_Q(4)=C_0z(18)+C_1z(17)+\ldots+C_5z(13)+C_6z(12)$$

Figure 5:
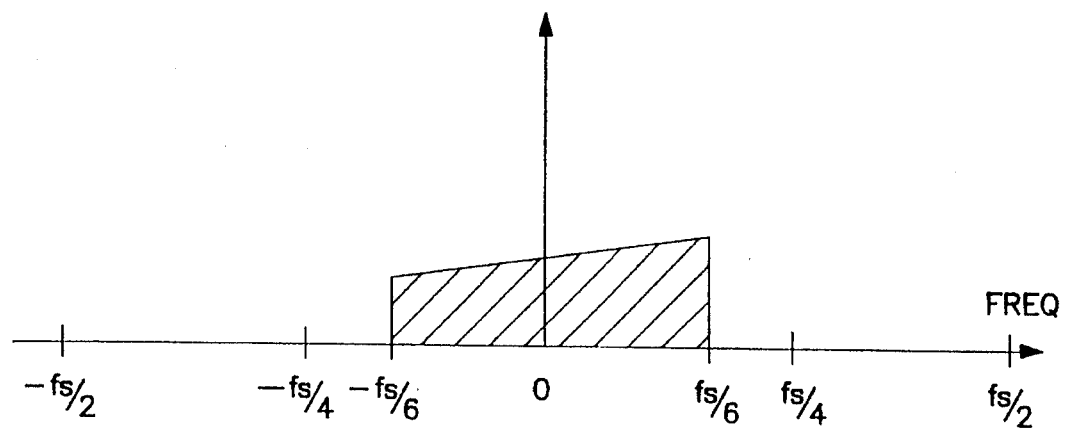
Figure 6:
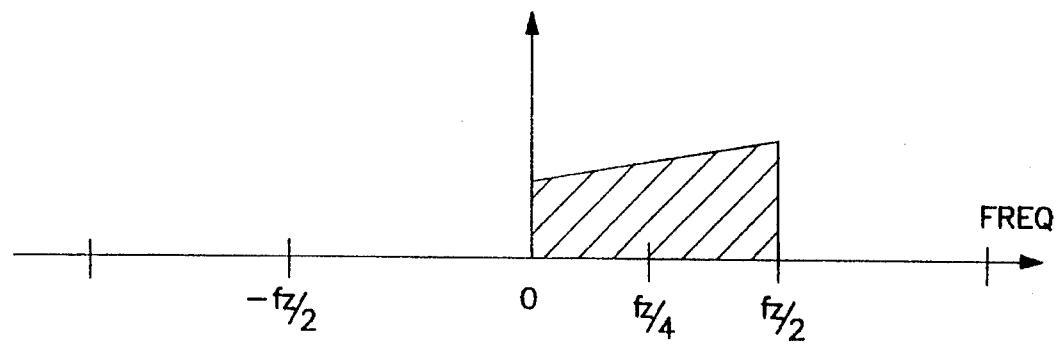
Figure 7:
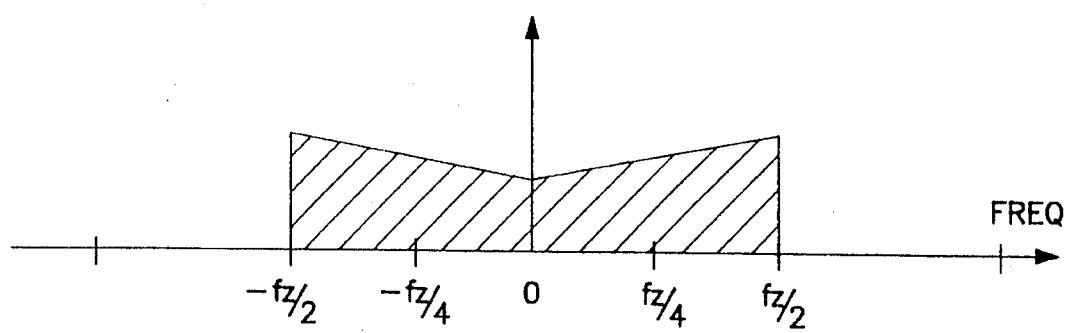

Thus the spectrum of $y_I+jY_Q$ is within the range $-f_s/6$ to $f_s/6$; see FIG. 5. Upconvert the frequencies by $f_z/4$ as before by multiplication by $e^{jn\pi/2}$ as shown by the spectrum in FIG. 6 where $f_z$ is the output sampling rate. An upconversion generally mixes the in-phase and quadrature signals to make the real and imaginary parts of the upconverted complex signal. Now take y(n) as the real part of upconverted complex signal $[y_I(n)+jy_Q(n)]e^{jn\pi/2}$ which will have a spectrum as in FIG. 7:

$$y(0)=y_I(0)=C_0x(6)+C_1x(5)+\ldots+C_5x(1)+C_6x(0)$$

$$y(1)=-y_Q(1)=-[C_0z(9)+C_1z(8)+\ldots+C_5z(4)+C_6z(3)]$$

$$y(2)=-y_I(2)=-[C_0x(12)+C_1x(11)+\ldots+C_5x(7)+C_6x(6)]$$

$$y(3)=y_Q(3)=C_0z(15)+C_1z(14)+\ldots+C_5z(10)+C_6z(9)$$

$$y(4)=y_I(4)=C_0x(18)+C_1x(17)+\ldots+C_5x(13)+C_6x(12)$$

The initial decimation factor of 3 is still apparent from the righthand ends of the expressions for y(n) in that successive y(n)s use inputs separated by three sampling time intervals. But because y(n) alternates between the output of filter 110 and filter 120 rather than a combination of the two outputs, the effective decimation factor for each filter is now 6. That is, filter 110 outputs y(0) from inputs x(0) . . . x(6) and its next used output is y(2) from inputs x(6) . . . x(12). Similarly for filter 120 outputting y(1), y(3), . . . In effect the use of two filters in parallel together with an upconversion from quadrature signal to real signal which uses alternate outputs of each filter permits each filter to run at half the expected output rate.

If the upconvert frequency had been φ, then the real part of $[y_I(n)+jy_Q(n)]e^{j2\pi\phi nT}$ would typically have involved both $y_I(n)$ and $y_Q(n)$ so the outputs of both filters 110 and 120 would be used in each y(n) and the extra decimation factor of 2 would have been lost.

It will be seen that in order to synchronize terms upconverted by multiplying by zero such as $y_I(1)$ and $y_Q(2)$, $y_I(3)$ and $y_Q(4)$, etc., the in-phase samples may be delayed by three time intervals. Alternatively, the quadrature samples may be delayed by three time intervals to synchronize $y_Q(0)$ with $y_I(1)$, $y_Q(2)$ with $y_I(3)$, etc. In either case, every second non-decimated calculation may be eliminated, producing an effective additional decimation factor of 2.

Realization

In light of the foregoing discussion of the basis for the methods according to the invention, there will now be discussed a device for implementing the digital filtering function presented.

Figure 8:
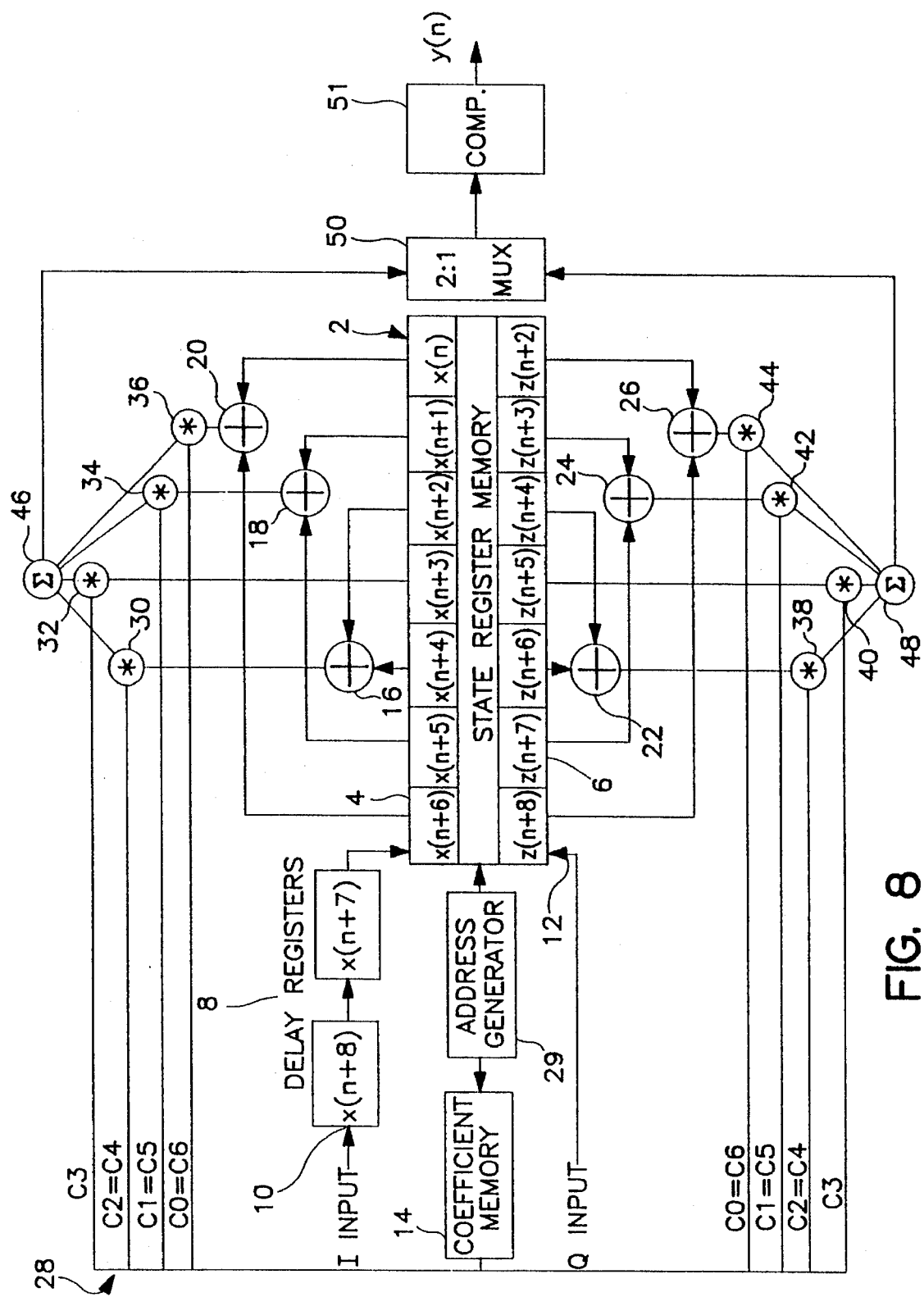
FIG. 8 is a detailed block diagram of a first preferred embodiment.

FIG. 8 shows a block diagram of a symmetric quadrature decimating finite impulse response filter according to the invention and for a decimation rate of R=2. A state register 2 includes an in-phase shift register 4 and a quadrature shift register 6. The state register 2 may preferably be implemented as a memory device. The filter shown has an order of seven. Accordingly, each of the registers 4 and 6 have seven stages coupled serially. A delay register 8 is shown coupled to a serial input of the in-phase register 4; note that "serial" means 1 word wide transfers, not just 1 bit wide. The delay register 8 delays for two time intervals, corresponding to the decimation factor of R=2. Time-stamped samples, such as x(n+6), z(n+8), etc., are shown in the stages of the registers 4 and 6 and in the delay register 8 to provide a snapshot showing an example of what samples might occupy what stages at a given point in time, and what their time relationships are.

It will be understood, however, that a delay register could be coupled to the input of the quadrature register 6 within the spirit and scope of the invention. Also, the number of stages in the delay register 8 could vary in accordance with variations in the decimation factor.

An in-phase input 10 provides a sequence of discrete time samples to the delay register 8. The samples shift serially through the delay register 8 into and through the in-phase register 4. A quadrature input 12 provides a sequence of discrete time samples to the quadrature register 6. Note that the inputs to the in-phase and quadrature registers are not necessarily signals that the signals are in quadrature.

The data samples in the stages of the in-phase register 4 and the quadrature register 6 are scaled according to a sequence of filter impulse response coefficients which are stored in a coefficient memory 14. The coefficients may vary in value, but are preferably symmetric in value, i.e., the magnitude of the first coefficient equals that of the last, the magnitude of the second coefficient equals that of the second-last, etc. In the particular filter shown in FIG. 8, C0=C6, C1=C5, and C2=C4. Accordingly, the coefficients are symmetric about C3. This particular symmetry is even, since the signs of the coefficients are the same. Alternatively, the symmetry could be odd, e.g., C0=–C6, C1=–C5, and C2=–C4. Because the coefficients are symmetric, samples which are to be scaled by the same coefficients may be added prior thereto by pre-adders 16, 18, 20, 22, 24, and 26. If the filter used odd symmetry coefficients, pre-subtractors could be used in place of these pre-adders.

The coefficients are provided from the coefficient memory 14 through lines shown collectively as 28. Scalers, which may be implemented as digital multipliers using an add-shift multiplication algorithm, are coupled to receive the coefficients over the lines 28 and the samples, some of which are already added from the pre-adders 16–26. The scalers then scale the samples or added samples. The scalers are shown as 30, 32, 34, 36, 38, 40, 42, and 44. An address generator 29 may be provided for addressing coefficients stored in the coefficient memory 14 and routing the coefficients over the lines 28 to the appropriate scalers. Note that a coefficient, say C0, is provided to scalers 36 and 44 simultaneously.

The scaled samples produced by the scalers 30–44 are received by adders 46 and 48, which respectively add the scaled samples to produce filtered in-phase and quadrature terms. The terms may then be upconverted as discussed above and added to produce a real signal from the sequences of in-phase and quadrature samples. A suitable adder may be used to add the in-phase and quadrature terms and to complement the appropriate terms in accordance with equation 8. This is an alternative to placing the complementer at the output.

The filter of FIG. 8 is implemented in accordance with the analysis provided above, in which the upconversion frequency was $f_s/4$ by appropriately complementing the sums at the output. Because, for each time interval either the in-phase or the quadrature term is upconverted by multiplying by 0 and the other term is multiplied by either 1 or –1, a filter in accordance with the invention is able to take advantage of these upconversion values and replace a relatively complex upconversion multiplication circuit and an adding circuit with much simpler circuitry. Indeed, multiplication by a negative amounts to subtraction and multiplication by a positive amounts to addition, so if addition and subtraction were interchanged in the filter computations, then complementation would be avoided.

Thus, the upconverter and adder may be implemented as a 2:1 multiplexer 50 and a complementer 51. The multiplexer 50 enables either the in-phase sum or the quadrature sum in accordance with the phase of the upconversion function (equation 8). The magnitude of the real and imaginary terms of the upconversion function is either 1 or 0 for the relevant phases, so a multiplexer may be used in place of a multiplier. To provide the appropriate sign, the complementer 51 is coupled to the output of the multiplexer 50 to complement the sign of the enabled sum in accordance with the phase of the upconversion function. By suitably enabling either the in-phase or the quadrature term through the multiplexer 50 and either complementing the enabled term or not depending on the phase of the upconversion function, the non-zero term may be provided to the output of the filter as a real signal.

Note that with the delay in registers 8, the filter of FIG. 8 simultaneously computes $y_I(2m)$ and $y_Q(2m+1)$ as the filter coefficients are retrieved from memory 14, but $y_Q(2m+1)$ is output after $y_I(2m)$. Thus adding another register between adder 48 and multiplexer 50 to hold $y_Q(2m+1)$ would permit the filter to begin computation of $y_I(2m+2)$ and $y_Q(2m+3)$ immediately upon completion of the computation of $y_I(2m)$ and $y_Q(2m+1)$ and thereby achieve the extra decimation by 2 even when the multiplications are not in parallel. More generally, if the overall decimation rate is R, then once every R time intervals an output, either $\pm y_I$ or $\pm y_Q$, must be provided by the filter. This means once every 2R time intervals a $y_I$ must be available, and similarly, once every 2R time intervals a $y_Q$ must be available. This was pointed out in the foregoing Example section. Now if the filter has order N, then N multiplications of samples x(n) with filter coefficients must be performed to compute $y_I$ and similarly N multiplications of samples z(n) with filter coefficients to compute $y_Q$. Thus if one filter coefficient is retrieved from memory 14 for each time interval and each (pipelined)

multiplication takes one time interval, then during the 2R time intervals between successive $y_I$s the N multiplications must be performed; similarly for successive $y_Q$s. This implies that the filter order N cannot exceed 2R, or conversely, that the overall decimation rate R must be at least N/2. Now if the filter coefficients were symmetric, then only half of the multiplications are needed if the samples x(n) can be preadded or presubstracted in pairs, similarly for the z(n). This implies for a symmetric filter as in FIG. 8 the overall decimation rate R must be at least N/4 if only one filter coefficient is retrieved in a time interval and each multiplication takes a time interval.

Figure 9:
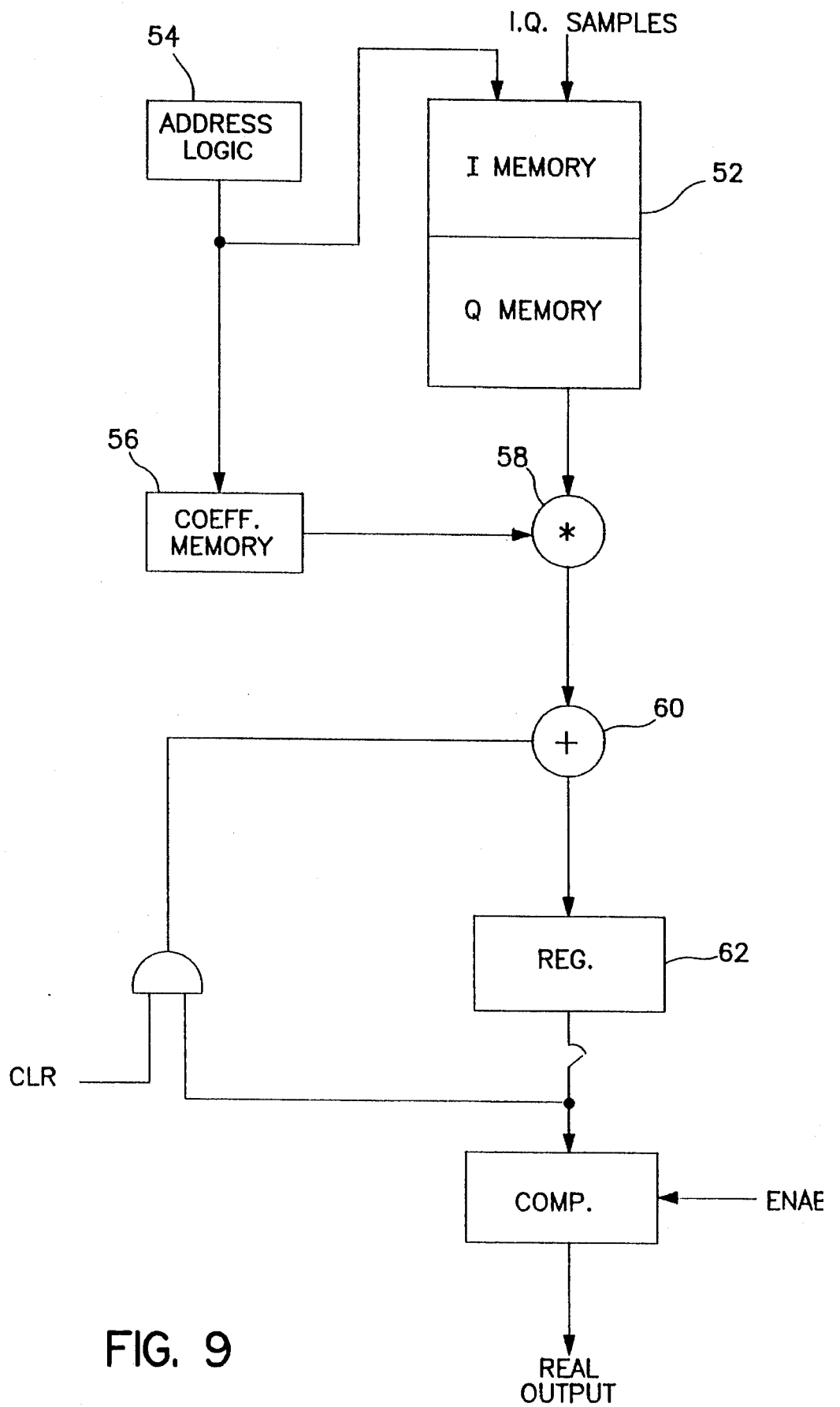
FIG. 9 is a detailed block diagram of a second embodiment.
Figure 10:
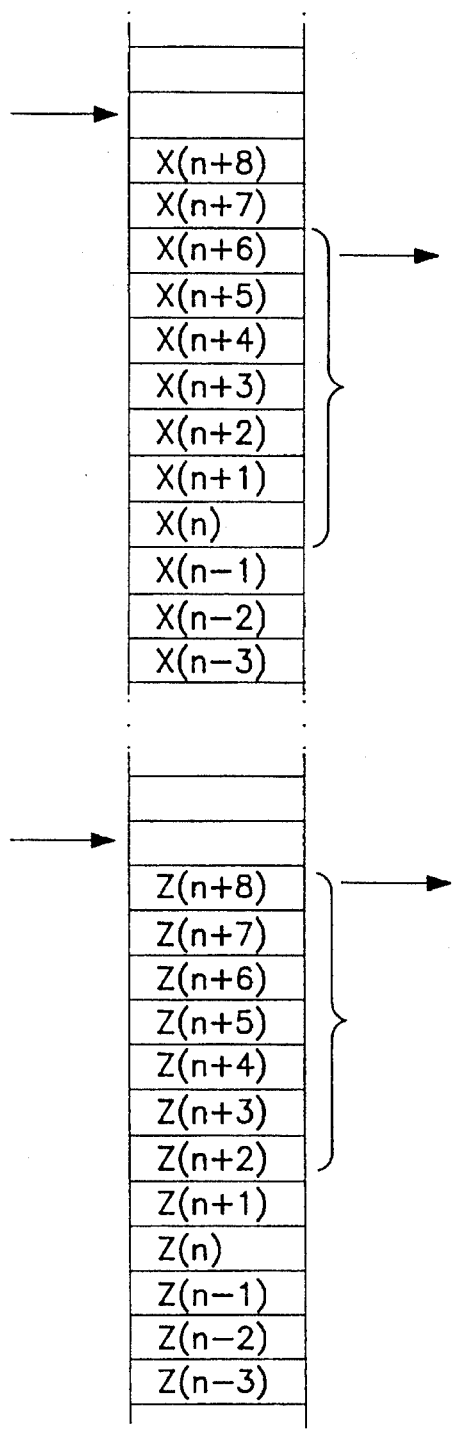
FIG. 10 is a partial memory map for the embodiment of FIG. 9.

A filter according to the invention might be implemented substantially in memory, as shown in FIGS. 9 and 10. A memory device 52 implemented in random access memory (RAM) is preferably configured as two queues, also known as circular buffers. A queue is a memory structure having a plurality of addressable locations for temporarily storing a stream of data words. A queue is a first-in, first-out (FIFO) data structure, and typically has an IN pointer and an OUT pointer. As each new data word is received, the word is stored in a memory location addressed by the IN pointer. Then, the IN pointer is incremented. When the IN pointer reaches the end of the buffer, instead of being incremented, the IN pointer is "wrapped around", i.e., moved back to the first memory location in the queue. Similarly, when a data word is read from the queue, the word is read from the memory location addressed by the OUT pointer. Then, the OUT pointer is incremented. The OUT pointer also wraps around when it reaches the end of the queue. Thus, as data moves into and out of the queue, the IN and OUT pointers chase each other around the queue.

The memory map of FIG. 10 illustrates how the memory 52 could be implemented as two queues. The IN pointers, on the left, each point to an empty location following the location occupied by the data sample received at time T(n+8). The next samples which will be received, x(n+9) and z(n+9), will be written into the respective next locations, and the two IN pointers will be incremented.

Each time the filter calculates a real output value, a number of samples equal to the order of the filter are read from each queue and scaled. In the illustrated embodiment, the filter order equals seven. Thus, for each calculation, a sequence of seven stored data words, beginning with the OUT pointer and counting backward from there, is read from each queue. Afterwards, the OUT pointers are incremented. To illustrate this, OUT pointers are shown to the right of the queues, pointing to the right. Braces, seven memory locations in width, are shown encompassing the seven data samples which are to be read and scaled for those positions of the OUT pointers. As the OUT pointers are incremented, the braces shift upward, one data word at a time.

To implement the pointers as discussed above, an address logic device 54 is coupled to an address bus of the memory device 52. The device 54 includes suitable circuitry for storing the values of the IN and OUT pointers, storing beginning and ending addresses of the queues for comparing with the IN and OUT pointers so that the pointers wrap around properly, and for addressing each of the seven memory locations to read all seven of the data samples for each calculation, while keeping track of the OUT pointer and incrementing it properly at the end of the calculation.

In order to implement the delay which is produced by the delay register 8 in the embodiment of FIG. 8, the OUT pointer for the in-phase queue is offset from that of the quadrature queue by two samples. That is, at the instant in which the snapshot of FIG. 10 was taken, the in-phase OUT pointer is at x(n+6), while the quadrature OUT pointer is at z(n+8). Thus, if a calculation were to be made from the state shown in FIG. 10, the calculations would be made according to equations 3 and 4 for $y_I(0)$ and $Y_Q(1)$.

Referring back to FIG. 9, it will be seen that the circuitry for calculating the sum of scaled samples is serial in nature, as opposed to the parallel circuitry of FIG. 8. The data samples are read one at a time from the memory 52, under the control of the device 54. Simultaneously, the device 54 addresses a coefficient memory 56, substantially similar to the coefficient memory 14, to read the corresponding coefficients. The coefficients are scaled, one at a time, by a scaler 58 substantially similar to the scalers 30–44. The scaled samples are added, one by one, by an adder 60. The sum is stored in a register 62. Each partial sum stored in the register 62 is added to the next scaled sample by the adder 60. The next partial sum thus produced is stored in the register 62. After all of the scaled samples have been added up, the register 62 contains the sum. In-phase and quadrature sums may then be multiplexed and complemented as in the embodiment of FIG. 8, to produce a real sum.

Implementing a filter according to the invention using queues as described in connection with FIGS. 9 and 10 presents an advantage if the memory capacity of the queues is larger than the order of the filter. As data samples are written into the memory locations addressed by the IN pointers, old data samples which have been in the memory locations since the last time the IN pointers passed over these locations before wrapping around are overwritten. However, until the old data samples are overwritten, they remain in the memory locations. Thus, the OUT pointers and the calculations could fall substantially behind the IN pointers. While this would be undesirable if the filter's computation rate precluded that the calculation of real sums in real time at regular intervals, the filter could be used in applications where the real sums are stored. In these latter applications, a processor doing the calculations could perform other tasks for a period of time, and then calculate several real sums one right after the other, using samples which accumulated during the period of time. Of course, in accordance with the invention the calculation of in-phase or quadrature terms upconverted by multiplying by 0 would still be omitted.

The implementations of FIGS. 8–10 could be in the form of integrated circuits, and the filters could also have alternative output formats.

The foregoing discussion has shown preferred embodiments of the invention and certain foreseeable alternatives. It is intended, however that these embodiments and alternatives be illustrative in nature, rather than representing an exhaustive survey of all possible implementations of the invention. It is intended that any and all variations which fall under the invention as recited in the appended claims be included within the spirit and scope of the invention.

FURTHER MODIFICATIONS AND VARIATIONS

The preferred embodiments may be modified in many ways while retaining one of more of the features of a delaying one of the in-phase or quadrature inputs so as to synchronize the in-phase and quadrature filter branch computations and thereby use a single read from coefficient memory for simultaneous computations in both branches in a symmetric quadrature filter, and multiplexing and complementing the in-phase and quadrature outputs to generate a real output by upconversion. That is, the delay implies the same filter coefficient is being used simultaneously in the two computations, so a common coefficient retrieval from storage may be used for both filter branches.

For example, the upconvert by $f_z/4$ could have been a downconvert by $f_z/4$. After an upconvert, the imaginary part of the complex signal may be taken to obtain a real signal. Indeed, the imaginary part of $[y_I(m)+jy_Q(m)]e^{jm\pi/2}$ yields the sequence $y_Q(0), y_I(1), -y_Q(2), -y_I(3), y_Q(4), \ldots$, so the same delay by one output sample interval (R input sample intervals) synchronizes the needed computations.

Further, the filters of the preferred embodiments could be changed to have different orders, nonsymmetric coefficients, Generally, a complex digital signal with sampling frequency $f_s$ input to filter 100 has real part $x(n)$ and imaginary part $z(n)$ which are lowpass filtered in FIRs 110 and 120, respectively, to yield outputs $u(n)$ and $v(n)$, respectively. The $u(n)$ and $v(n)$ outputs are oversampled because the FIR filtering has eliminated their higher frequencies. Thus the input sampling rate $f_s$ may be decimated to yield the output sampling rate $f_z$ with the amount of decimation permissible dependent upon the filter passband width. When the sampling rate decimation factor R is at least 2, the complex $u(n)+jv(n)$ output may be upconverted by $f_z/4$ without aliasing and make all of the frequencies nonnegative, so the real [or the imaginary] part of the upconverted complex output can be taken to give a real overall output which includes information from both $u(n)$ and $v(n)$. Again, the samples of the upconversion factor at the output sampling rate are $1, j, -1, -j, 1, j, \ldots$. Thus the real part of the upconverted complex output is the sequence $u(0), -v(R), -u(2R), v(3R), u(4R), -v(5R), \ldots$ and this is analogous to the examples in which $y_I(m)=u(Rm)$ and $y_Q(m)=v(Rm)$. Hence, the computations needed for the real overall output can again be synchronized by delaying the $x(n)$ input by R, as illustrated in the examples, or by delaying the $z(n)$ input by R. Also, the negative signs may be inserted by a complementer following the multiplexing of the outputs, or the additions and subtractions in the filter computations may be switched to generate the negative signs.

What is claimed is:

1. A digital filter, comprising:
   (a) a first filter branch with first branch input and first branch output and filter coefficients $c_j$;
   (b) a second filter branch with second branch input and second branch output and filter coefficients said $c_j$;
   (c) a delay of R input sample intervals at said first branch input where R is a positive integer equal to the ratio of an input sampling rate to an output sampling rate; and
   (d) an output formatter with inputs coupled to said first and second branch outputs and alternating passing output samples from said first and second branch outputs at said output sampling rate;
   (e) whereby real data streams $x(n)$ and $z(n)$ entering said delay and said second branch input, respectively, are filtered in said first and second branches by simultaneous multiplications of $x(n)$ and $z(n+R)$ by coefficients $c_j$ and additions or subtractions of the multiplication products to yield first branch output $u(n)$ and second branch output $v(n+R)$ up converted by one quarter of said output sampling frequency and combined and decimated to form a real filter output $u(n), -v(n+R), -u(n+2R), v(n+3R), u(n+4R), -v(n+5R)$.

2. The filter of claim 1, wherein:
   (a) said formatter includes a multiplexer followed by a complementer.

3. The filter of claim 1, wherein:
   (a) said formatter includes a multiplexer; and
   (b) the alternating signs on said real filter output are produced by switching between additions and subtractions.

4. The filter of claim 1, wherein:
   (a) said coefficients $c_j$ are stored in a memory;
   (b) said first branch plus said delay include N+R sequentially-connected registers;
   (c) said second branch includes N sequentially-connected registers; and
   (d) read circuitry coupled to said memory, said first branch, and said second branch, wherein said read circuitry provides simultaneously (i) a coefficient $c_i$ from said memory and contents of the kth of said N registers to computation circuitry of said second branch and (ii) said coefficient $c_i$ and contents of the (k+R)th of said N+R registers to computation circuitry of said first branch.

5. The filter of claim 1, wherein:
   (a) said first branch includes N+R locations in a first queue in random access memory;
   (b) said second branch includes N locations in a second queue in random access memory; and
   (c) an address generator sending read and write addresses to said queues with said addresses related by (i) when a read address for the ith location in said first queue and a read address for the kth location in said second queue are simultaneously sent, then the first following write addresses simultaneously sent to said first queue and said second queue will be locations which differ by i−k+R.

6. The filter of claim 1, wherein:
   (a) R equals 2.

7. A digital filter, comprising:
   (a) a first filter branch with first branch input and first branch output;
   (b) a second filter branch with second branch input and second branch output, and with the same filter coefficients simultaneously used on data streams in said first and second branches;
   (c) a delay of R input sample intervals at said first branch input where R is a positive integer; and
   (d) a multiplexer with inputs coupled to said first and second branch outputs and alternating passing output samples from said first and second branch outputs at output sample intervals of length R times the length of said input sample intervals;
   (e) whereby first and second real data streams entering said delay and said second branch input, respectively, are filtered in said first and second branches and up converted at one quarter of an output sampling frequency and combined to form a real filter output.

8. The filter of claim 7, wherein:
   (a) a complementer connected to said multiplexer negates alternating ones of each of said passing output samples.

9. The filter of claim 7, wherein:
   (a) switching additions and subtractions in said first and second branches negates alternating ones of each of said passing output samples.

10. A method of digitally filtering a complex digital data stream to yield a real digital data stream, comprising the steps of:
    (a) providing first and second real filter branches with said second branch having the same filter coefficients as said first branch;

(b) applying the real part of a complex digital data stream to an input of said first branch after a delay of R input sampling intervals and thereby forming a first digital data stream with samples every 2R input sampling intervals;

(c) applying the imaginary part of a complex digital data stream to an input of said second branch and thereby forming a second digital data stream with samples every 2R input sampling intervals and delayed R sampling intervals from said first digital data stream; and then (d) interleaving said first and second data streams to form a real digital data stream with output sampling interval R times said input sampling interval.

11. The method of claim 10, wherein:

(a) said first and second real filter branches are lowpass filters; and (b) said complex digital data stream is a down-converted complex analytic data stream.

12. The method of claim 10, wherein:

(a) R equals 2.

13. A quadrature decimating FIR filter with complex to real signal conversion comprising:

plural quadrature filter branches including an in-phase filter branch and a quadrature-phase filter branch, at least one of said branches having a delay means, and at least two of said branches having common impulse responses; and conversion means for converting the output of said branches to a real signal.

14. The filter of claim 13 wherein said delay means is a shift register.

15. The filter of claim 13 wherein said conversion means comprises a multiplexer and a complementer whereby said multiplexer successively passes the output of each filter branch and said complementer negates every other passed sample of each output to thereby produce a real signal.

16. A method of filtering a complex signal and converting said complex signal into a real signal comprising the steps of:

(a) providing a complex digital signal having an in-phase component and a quadrature component, each of said components comprised of a series of discrete time samples;

(b) delaying one of said components by an amount specified by a selected decimation rate;

(c) sampling each component to thereby produce a sampled in-phase component and a sampled quadrature component;

(d) scaling said sampled in-phase component and said sampled quadrature component to thereby produce an in-phase filter output and a quadrature filter output;

(e) upconverting said in-phase filter output and said quadrature filter output to thereby produce a real signal.

17. The method of claim 16 wherein said sampling step comprises the steps of:

(a) providing an in-phase shift register and a quadrature shift register each having an equal number of plural stages;

(b) incrementally shifting discrete time samples of the in-phase component and the quadrature component through each stage of their respective registers; and (c) sampling the in-phase component and the quadrature component after a predetermined number of shifts corresponding to a specified decimation rate.

18. The method of claim 16 wherein said scaling step comprises the steps of:

(a) providing a plurality of filter coefficients; and (b) multiplying said sampled in-phase component and said sampled quadrature component by said filter coefficients.

19. The method of claim 16 wherein said upconverting step comprises the steps of:

(a) multiplexing said in-phase filter output and said quadrature filter output by successively passing a sample of each to thereby produce a real signal;

(c) complementing said real signal by negating every other passed sample of said in-phase filter output and said quadrature filter output.

20. A method of filtering a complex signal and converting said complex signal into a real signal comprising the steps of:

(a) providing a complex digital signal having an in-phase component and a quadrature component, each of said components comprised of a series of discrete time samples;

(b) providing two shift registers, one dedicated to said in-phase component and one dedicated to said quadrature component, each of said shift registers having an equal number of plural stages, each of said plural stages capable of holding at least one of said discrete time samples;

(c) providing plural filter coefficients the number of which equals the number of said plural stages with each of said coefficients symmetrically assigned to one of said plural stages in each of said shift registers such that each of said plural stages in each of said registers has a corresponding symmetric partner with the exception of the center plural stage in each of said registers;

(d) delaying each of said time samples of either the in-phase component or the quadrature component by an amount corresponding to a predetermined decimation rate;

(e) serially shifting said discrete time samples of said in-phase component and said quadrature component into, through and out of their respective shift registers;

(f) after every predetermined number of shifts corresponding to a specified decimation rate, sequentially
 (1) adding each plural stage with its symmetric partner,
 (2) multiplying each added output and the center plural stage by their respective coefficients,
 (3) adding each of the multiplication outputs to thereby produce a decimated filtered sample of both the in-phase component and the quadrature component;

(g) upconverting said decimated filtered samples by successively passing samples of each to thereby produce a real signal; and (h) complementing every other passed signal of each decimated filter sample.

* * * * *